(12) United States Patent
Chang et al.

(10) Patent No.: US 11,189,654 B2
(45) Date of Patent: Nov. 30, 2021

(54) MANUFACTURING METHODS OF SEMICONDUCTOR IMAGE SENSOR DEVICES

(71) Applicant: Taiwan Semiconductor Manufacturing Co., Ltd., Hsinchu (TW)

(72) Inventors: Chao-Ching Chang, Kaohsiung (TW); Sheng-Chan Li, Tainan (TW); Chih-Hui Huang, Tainan (TW); Jian-Shin Tsai, Tainan (TW); Cheng-Yi Wu, Taichung (TW); Chia-Hsing Chou, Tainan (TW); Yi-Ming Lin, Tainan (TW); Min-Hui Lin, Tainan (TW); Chin-Szu Lee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/900,985

(22) Filed: Jun. 14, 2020

(65) Prior Publication Data

US 2020/0312894 A1 Oct. 1, 2020

Related U.S. Application Data

(63) Continuation of application No. 15/054,094, filed on Feb. 25, 2016, now abandoned.

(51) Int. Cl.
*H01L 21/02* (2006.01)
*H01L 27/146* (2006.01)
*H01L 21/762* (2006.01)

(52) U.S. Cl.
CPC ...... *H01L 27/1463* (2013.01); *H01L 21/0228* (2013.01); *H01L 21/02211* (2013.01);
(Continued)

(58) Field of Classification Search
CPC ............. H01L 27/1463; H01L 27/1464; H01L 27/14643; H01L 27/14683;
(Continued)

(56) References Cited

U.S. PATENT DOCUMENTS

| 2009/0020842 A1* | 1/2009 | Shiau | H01L 21/76898 257/459 |
| 2009/0200625 A1* | 8/2009 | Venezia | H01L 27/14645 257/432 |

(Continued)

FOREIGN PATENT DOCUMENTS

CN 102651376 8/2012

OTHER PUBLICATIONS

"Office Action of China Counterpart Application", dated Feb. 2, 2021, p. 1-p. 10.

*Primary Examiner* — Jarrett J Stark
(74) *Attorney, Agent, or Firm* — JCIPRNET

(57) ABSTRACT

A plurality of radiation-sensing doped regions are formed in a substrate. A trench is formed in the substrate between the radiation-sensing doped regions. A SiOCN layer is filled in the trench by reacting Bis(tertiary-butylamino)silane (BT-BAS) and a gas mixture comprising $N_2O$, $N_2$ and $O_2$ through a plasma enhanced atomic layer deposition (PEALD) method, to form an isolation structure between the radiation-sensing doped regions.

20 Claims, 7 Drawing Sheets

(52) U.S. Cl.
CPC .. *H01L 21/02274* (2013.01); *H01L 21/76224* (2013.01); *H01L 27/1464* (2013.01); *H01L 27/14643* (2013.01); *H01L 27/14683* (2013.01)

(58) Field of Classification Search
CPC ......... H01L 21/02211; H01L 21/02274; H01L 21/0228; H01L 21/76224; H01L 27/146–14893
USPC ......... 257/446, 440, 443; 438/65, 66, 73, 81
See application file for complete search history.

(56) References Cited

U.S. PATENT DOCUMENTS

| | | | | |
|---|---|---|---|---|
| 2012/0009720 | A1* | 1/2012 | Shim | H01L 27/14685 438/70 |
| 2012/0153127 | A1* | 6/2012 | Hirigoyen | H01L 27/14609 250/208.1 |
| 2012/0193785 | A1* | 8/2012 | Lin | H01L 24/97 257/737 |
| 2012/0217601 | A1 | 8/2012 | Miyanami | |
| 2013/0084660 | A1* | 4/2013 | Lu | H01L 27/14689 438/14 |
| 2013/0113061 | A1* | 5/2013 | Lai | H01L 21/223 257/432 |
| 2013/0196516 | A1* | 8/2013 | Lavoie | C23C 16/325 438/776 |
| 2013/0285130 | A1* | 10/2013 | Ting | H01L 27/1463 257/291 |
| 2013/0341685 | A1* | 12/2013 | Chou | H01L 29/6659 257/288 |
| 2014/0110809 | A1* | 4/2014 | Kitamura | H01L 27/1464 257/435 |
| 2014/0252521 | A1* | 9/2014 | Kao | H01L 27/14623 257/432 |
| 2014/0327051 | A1* | 11/2014 | Ahn | H01L 27/1463 257/228 |
| 2015/0256769 | A1* | 9/2015 | Kim | H01L 27/14645 348/302 |
| 2016/0172412 | A1* | 6/2016 | Lee | H01L 27/14605 257/432 |
| 2016/0204150 | A1* | 7/2016 | Oh | H01L 27/14638 257/229 |
| 2016/0211290 | A1* | 7/2016 | Tsai | H01L 27/1464 |
| 2016/0329365 | A1* | 11/2016 | Tekleab | H01L 27/14689 |
| 2016/0351604 | A1* | 12/2016 | Kalnitsky | H01L 27/1463 |
| 2017/0257554 | A1* | 9/2017 | Huang | H04N 5/2254 |
| 2018/0374884 | A1* | 12/2018 | Cheng | H01L 27/14623 |
| 2019/0043901 | A1* | 2/2019 | Honda | H01L 27/14627 |
| 2019/0067354 | A1* | 2/2019 | Cheng | H01L 27/14629 |
| 2019/0096929 | A1* | 3/2019 | Chiang | H01L 27/14643 |
| 2020/0312894 | A1* | 10/2020 | Chang | H01L 27/1463 |

* cited by examiner

MANUFACTURING METHODS OF SEMICONDUCTOR IMAGE SENSOR DEVICES

CROSS-REFERENCE TO RELATED APPLICATION

This application is a continuation application of and claims the priority benefit of a prior application Ser. No. 15/054,094, filed on Feb. 25, 2016. The entirety of the above-mentioned patent application is hereby incorporated by reference herein and made a part of this specification.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

In recent years, the semiconductor integrated circuit (IC) industry has experienced rapid growth. Technological advances in IC materials and design have produced generations of ICs where each generation has smaller and more complex circuits than the previous generation. As a part of the IC evolution for semiconductor image sensors, the size of the radiation-sensitive pixels has been steadily reduced. As the pixels and the separation between adjacent pixels continue to shrink, issues such as excessive current leakage become more difficult to control. It is known that excessive current leakage from light-sensitive (e.g., photodiode) regions causes white spot problems (i.e., white pixels) in CMOS image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
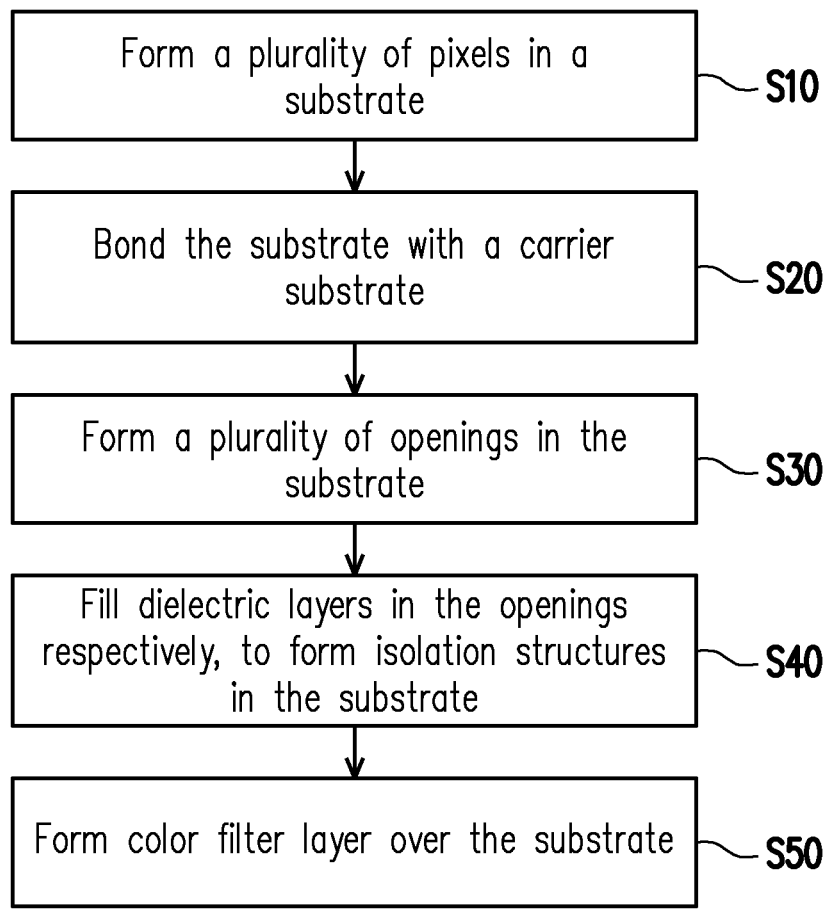
FIG. 1 is a flow chart illustrating a manufacturing method of a semiconductor image sensor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a manufacturing method of a semiconductor image sensor device in accordance with some embodiments. FIG. 2A to FIG. 2F are cross-sectional views illustrating a manufacturing method of a semiconductor image sensor device in accordance with some embodiments.

Figure 2A:
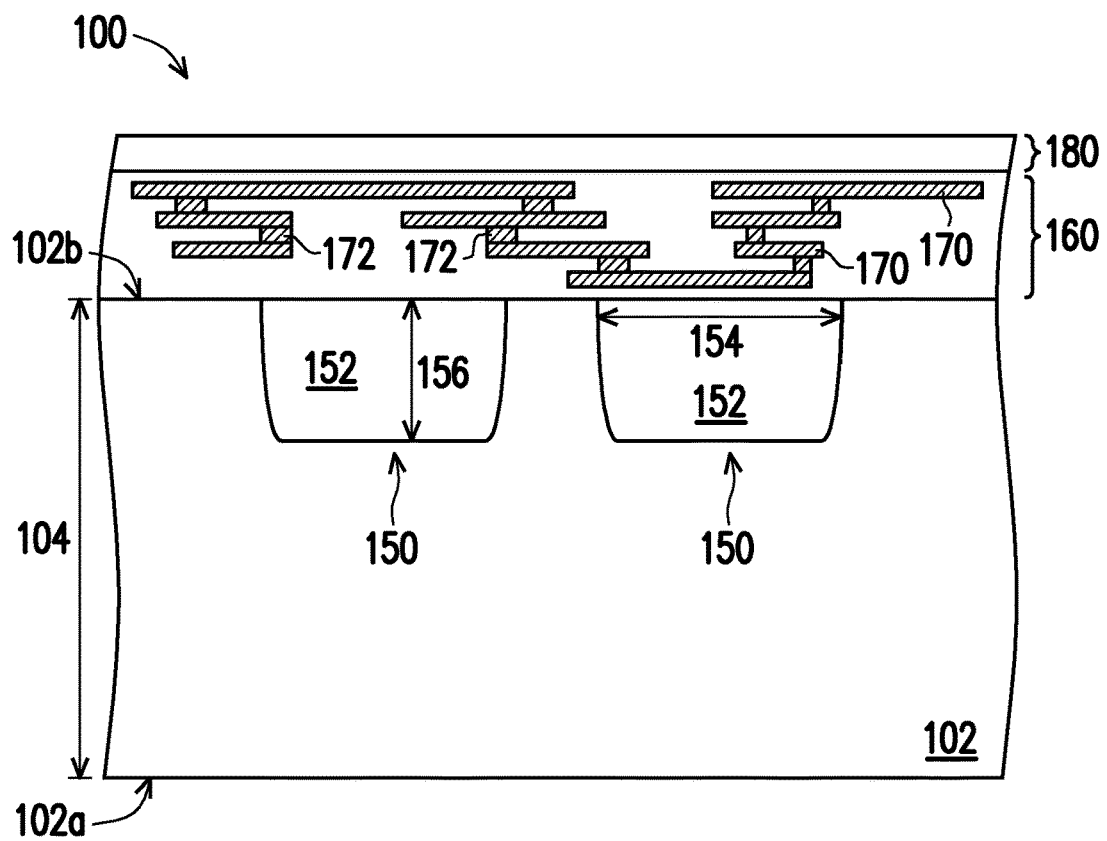
FIG. 2A to FIG. 2F are cross-sectional views illustrating a manufacturing method of a semiconductor image sensor device in accordance with some embodiments.

Referring to FIG. 1 and FIG. 2A, in Step 10, a plurality of pixels 150 is formed in a substrate 102. In some embodiment, a semiconductor image sensor device 100 is provided, wherein the semiconductor image sensor device 100 includes the substrate 102. In some embodiment, the substrate 102 is, for example, a silicon substrate doped with a p-type dopant such as boron and thus is a p-type substrate. Alternatively, the substrate 102 could be another suitable semiconductor material. For example, the substrate 102 may be a silicon substrate doped with an n-type dopant such as phosphorous or arsenic and thus is an n-type substrate. In alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 102 could include an epitaxial layer (epi layer), may be strained for performance enhancement. In some embodiments, the substrate 102 is with one or more fins (not shown) thereon.

In some embodiment, the substrate 102 has a first surface 102a and a second surface 102b opposite to the first surface 102a. In some embodiment, the first surface 102a is, for example, a back surface, and the second surface 102b is, for example, a front surface. In some embodiment, the semiconductor image sensor device 100 is a back side illuminated (BSI) image sensor device, radiation is projected from a back surface (for example, the first surface 102a) after thinning down and enters the remaining epitaxial layer through the back surface. The reversed device is supported by a carrier wafer. In some embodiments, the initial thickness 104 of the substrate 102 is in a range from about 100 microns (um) to about 3000 um, for example, between about 500 um and about 1000 um. In some embodiment, a plurality of shallow trench isolation (STI) structures (not shown) is formed in the substrate 102. In some embodiments, the STI structures are formed by the following process steps: etching openings into the substrate 102 from the second surface 102b; filling the openings with a dielectric material such as silicon oxide, silicon nitride, silicon oxynitride, a low-k material, or another suitable dielectric material; and thereafter performing a polishing process, for example, a chemical mechanical polishing (CMP) process, to planarize the surface of the dielectric material filling the openings.

In some embodiments, active devices such as fin-type field effect transistor (FinFET), metal-oxide-semiconductor field-effect transistor (MOSFETs), complementary metal-oxide-semiconductor (CMOS) transistors, high voltage transistors, and/or high frequency transistors; other suitable components; and/or combinations thereof are disposed in the substrate 102.

In some embodiments, the pixels 150 contain radiation-sensing doped regions 152. In some embodiments, the radiation-sensing doped regions 152 are formed between isolation structures such as STIs. In some embodiments, the radiation-sensing doped regions 152 are formed by one or more ion implantation processes or diffusion processes and are doped with a doping polarity opposite from that of the substrate 102. For example, if the substrate 102 is a p-type substrate, the radiation-sensing doped regions 152 are n-type doped regions. In some embodiments, the pixels 150 each include a photodiode. In alternative embodiments, a deep implant region may be formed below each photodiode. In alternative embodiments, the pixels 150 may include pinned layer photodiodes, photogates, reset transistors, source follower transistors, or transfer transistors. In some embodiments, the pixels 150 may also be referred to as radiation-detection devices or light-sensors.

In some embodiments, the pixels 150 may be varied from one another to have different junction depths, thicknesses, widths, and so forth. In some embodiments, the pixels 150 have a depth (vertical dimension) 154 ranging from about 1 um to about 4 um, and a width (horizontal dimension) 156 ranging from about 0.5 um to about 2 um.

In some embodiments, an interconnect structure 160 is formed over a second surface 102b of a substrate 102. The interconnect structure 160 includes a plurality of patterned dielectric layers and conductive layers that provide interconnections (e.g., wiring) between the various doped features, circuitry, and input/output of the semiconductor image sensor device 100. In some embodiments, the interconnect structure 160 includes an interlayer dielectric (ILD) and a multilayer interconnect (MLI) structure. In some embodiments, the MLI structure includes contacts, vias and metal lines. For purposes of illustration, a plurality of conductive lines 170 and vias/contacts 172 are shown in FIG. 2A, it being understood that the conductive lines 170 and vias/contacts 172 illustrated are merely exemplary, and the actual positioning and configuration of the conductive lines 170 and vias/contacts 172 may vary depending on design needs and manufacturing concerns.

In some embodiments, the MLI structure may include conductive materials such as aluminum, aluminum/silicon/copper alloy, titanium, titanium nitride, tungsten, polysilicon, metal silicide, or combinations thereof, being referred to as aluminum interconnects. In some embodiments, aluminum interconnects may be formed by a deposition process including physical vapor deposition (PVD), chemical vapor deposition (CVD), atomic layer deposition (ALD), sputtering, or other suitable processes. In some embodiments, a forming method of the MLI structure may include photolithography processing and etching to pattern the conductive materials for vertical connection (for example, the vias/contacts 172) and horizontal connection (for example, the conductive lines 170). In alternative embodiments, the MLI structure may include a copper multilayer interconnect. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 2A, a buffer layer 180 is formed over the interconnect structure 160. In some embodiments, the buffer layer 180 includes a dielectric material such as silicon oxide. In alternative embodiments, the buffer layer 180 may optionally include silicon nitride. In some embodiments, the buffer layer 180 is formed by CVD, PVD, or other suitable techniques. In some embodiments, the buffer layer 180 is planarized to form a smooth surface by a CMP process.

Figure 2B:
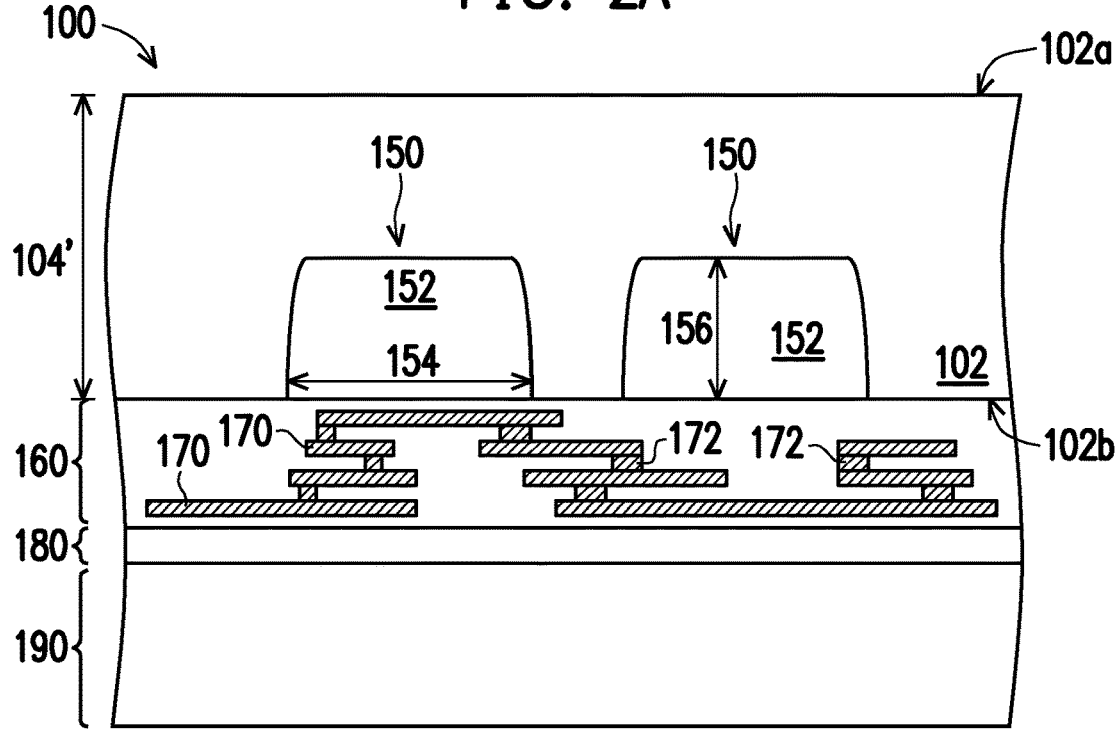

Referring to FIG. 1 and FIG. 2B, in Step 20, the substrate 102 is bonded with a carrier substrate 190, so that processing of the first surface 102a of the substrate 102 can be performed. In some embodiments, the substrate 102 is bonded with the carrier substrate 190 through the buffer layer 180. In some embodiments, the carrier substrate 190 is similar to the substrate 102 and includes a silicon material, for example. In alternative embodiments, the carrier substrate 190 may include a glass substrate or another suitable material. In some embodiments, the carrier substrate 190 may be bonded to the substrate 102 by molecular forces (that is, a technique known as direct bonding or optical fusion bonding) or by other bonding techniques known in the art, such as metal diffusion or anodic bonding.

In some embodiments, after the carrier substrate 190 is bonded, a thinning process is then performed to thin the substrate 102 from the first surface 102a. In some embodiments, the thinning process may include a mechanical grinding process and a chemical thinning process. In some embodiments, a substantial amount of substrate material may be first removed from the substrate 102 during the mechanical grinding process. Afterwards, the chemical thinning process may apply an etching chemical to the first surface 102a of the substrate 102 to further thin the substrate 102 to a thickness 104', which is on the order of a few microns. In some embodiments, the thickness 104' is greater than about 1 um but less than about 5 um. It is also understood that the particular thicknesses disclosed in some embodiments are mere examples and that other thicknesses may be implemented depending on the type of application and design requirements of the semiconductor image sensor device 100.

Figure 2C:
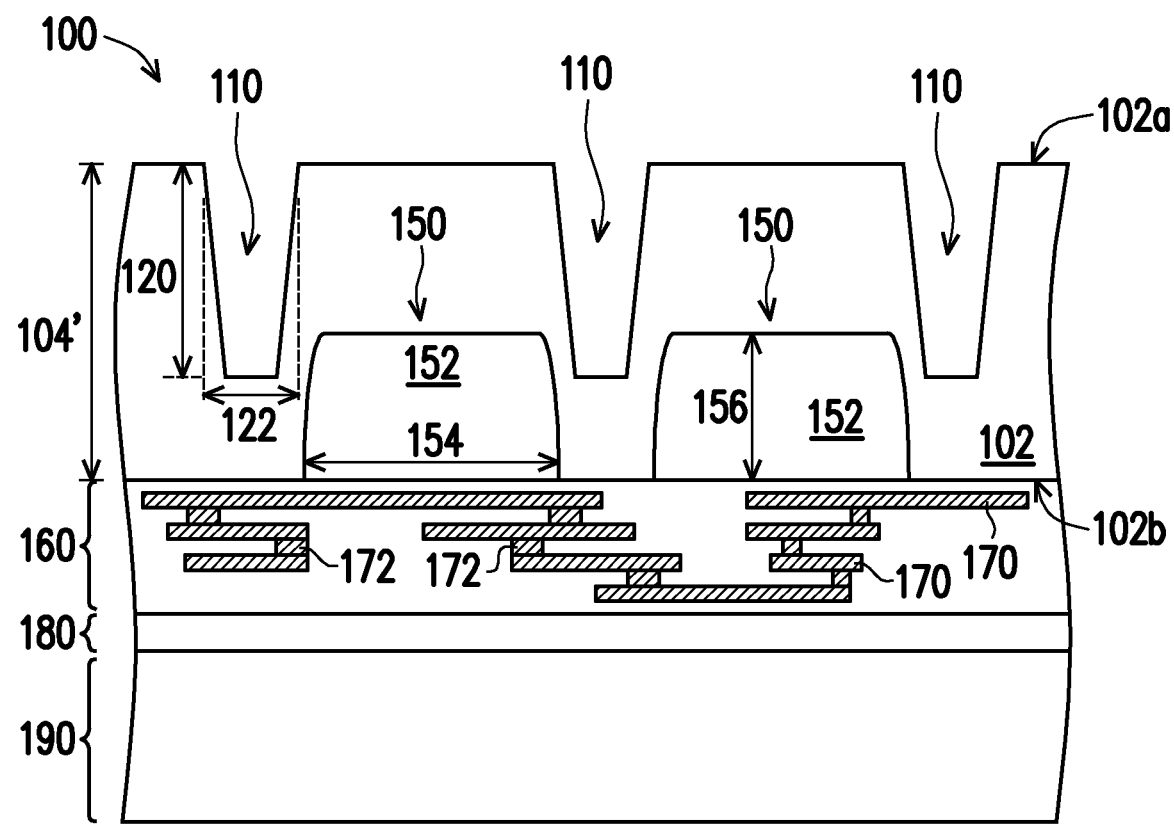

Referring to FIG. 1 and FIG. 2C, in Step 30, a plurality of openings 110 is formed in the substrate 102. In some embodiments, the openings 110 are openings for the DTI structures. In some embodiment, the openings 110 are formed in the substrate 102 and extend from the first surface 102a of the substrate 102 toward the interior of the substrate 102. In some embodiment, the openings 110 are formed by an etching process such as a wet etching process or a dry etching process. For example, the wet etching process can be achieved with potassium hydroxide (KOH), tetramethylammonium hydroxide (TMAH) or another suitable etching chemistry, and the dry etching process can be achieved with sulfur hexafluoride ($SF_6$) or another suitable gas. In some embodiment, an etching mask (for example a hard mask, not illustrated herein) may be formed before the etching process is performed to define the size and location of the openings 110. In some embodiment, only three openings 110 are shown in FIG. 2C for the sake of providing an illustration. In some embodiment, the openings 110 are the trenches for the DTI structures, which will be formed later by filling the openings 110. In some embodiments, the openings 110 may be formed to have a trapezoidal shape, a somewhat rectangular shape, or another suitable shape. In some embodiments, the openings 110 each have a depth 120, which measures the amount of extension into the substrate 102 from the first surface 102a. In some embodiment, the depth 120 is greater than the depth of the STI structures, since the openings 110 are the trenches for deep (as opposed to shallow) trench isolation structures. In some embodiment, the depth 120 of the openings 110 is in a range from about 0.2 um to about 3 um, for example, 0.5 μm to 1.5 μm. In some embodiment, the openings 110 each have a width 122, and the width 122 is in a range from about 0.05 um to about 0.2 um. In some embodiment, a ratio of depth to width of the openings 110 ranges from 2 to 20.

Figure 2D:
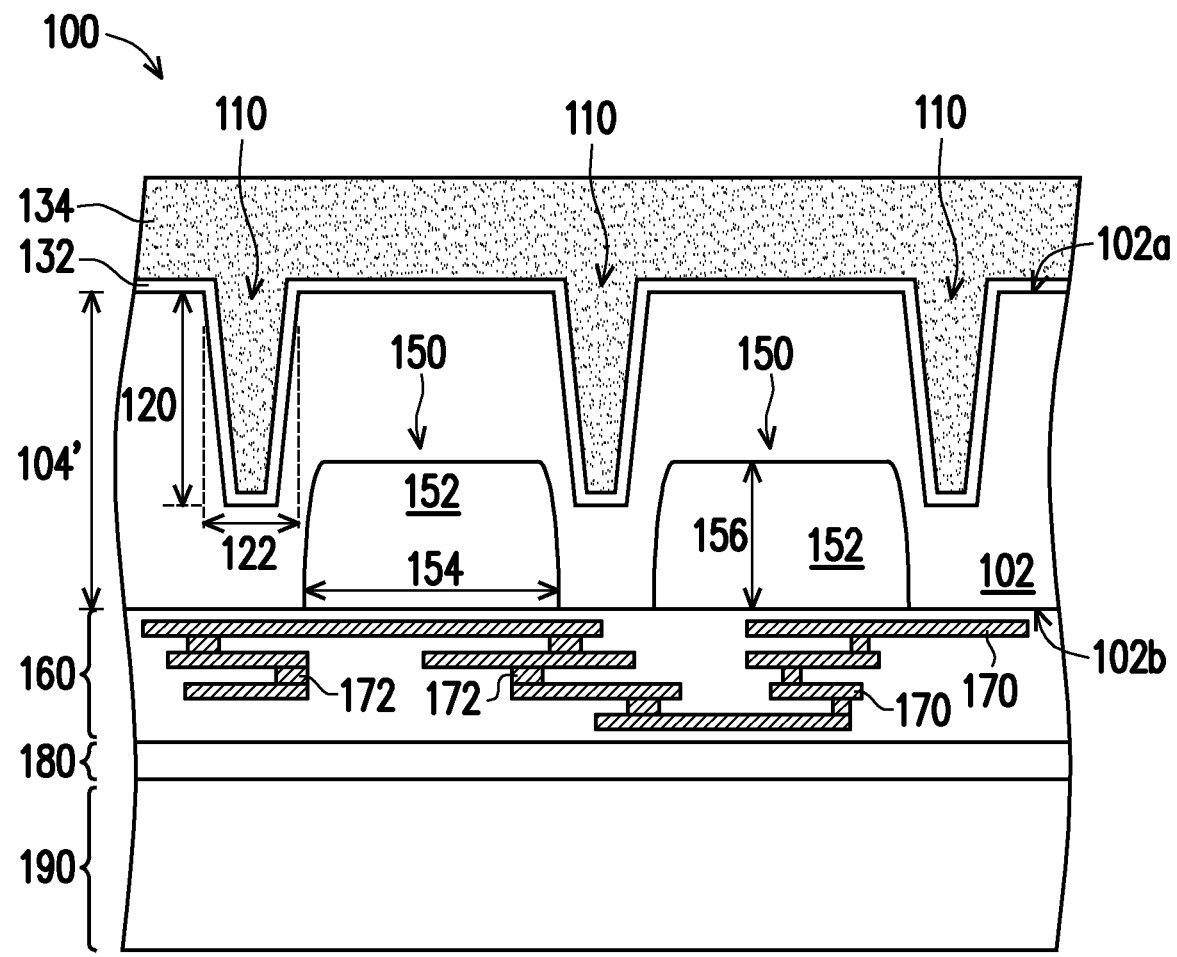
Figure 2E:
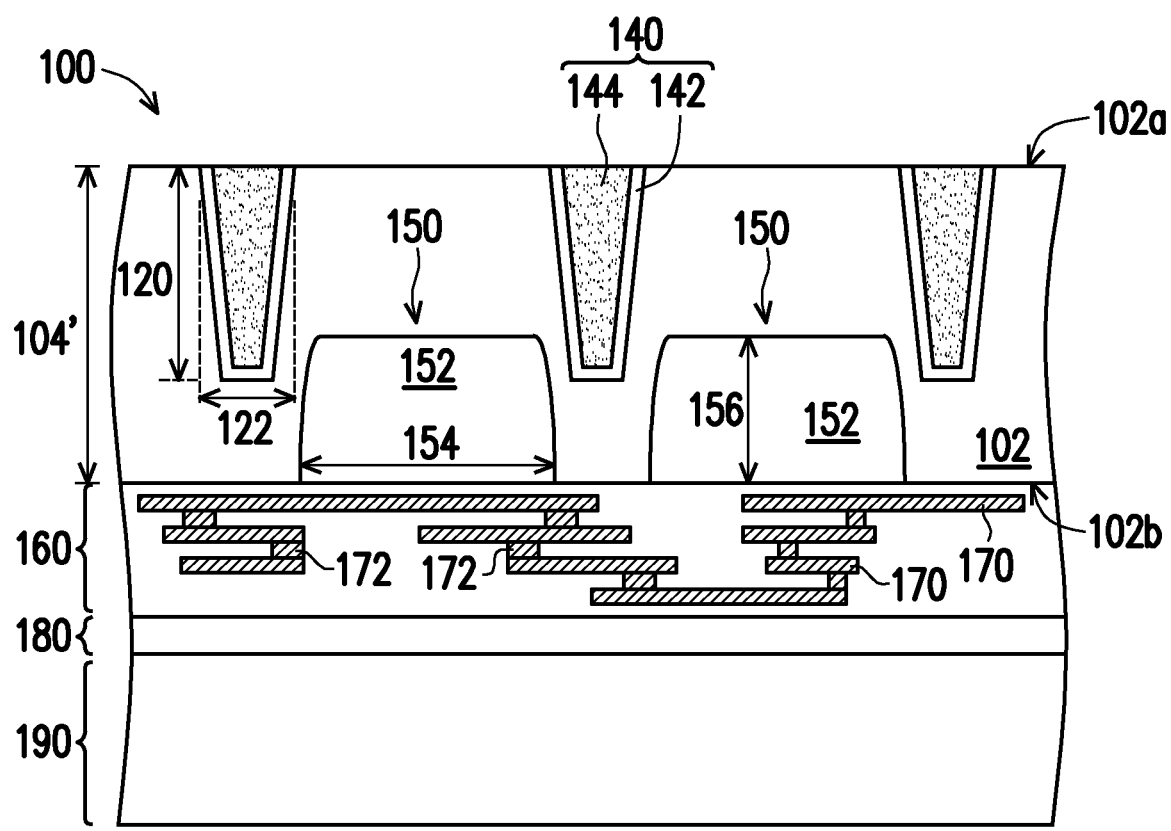

Referring to FIG. 1 and FIGS. 2D and 2E, in Step 40, dielectric layers 144 are filled in the openings 110 respectively, to form isolation structures 140 in the substrate 102. Specifically, as shown in FIG. 2D, a dielectric material 134 is formed over the substrate 102 from the first surface 102a. The dielectric material 134 fills the openings 110. In some embodiments, the dielectric material 134 includes silicon oxycarbonitride (SiOCN). In some embodiments, in addition to including SiOCN, the dielectric material 134 further includes at least one of silicon oxide ($SiO_2$), silicon carbide (SiC) and silicon carbonitride (SiCN). In some embodiments, the dielectric material 134 is formed by reacting a source of both silicon and carbon with a gas mixture comprising oxygen and nitrogen. In some embodiments, Bis(tertiary-butylamino)silane (BTBAS) acts as a source of both silicon and carbon, and the gas mixture includes $N_2O$, $N_2$ and $O_2$, for example. In some embodiments, Argon is used as a diluted or carrier gas, for example. In some embodiments, the dielectric material 134 is formed in the openings 110 by atomic layer deposition (ALD) method such as plasma enhanced atomic layer deposition (PEALD) method. It is noted that since the dielectric material 134 is formed by ALD method, the openings 110 is filled with the dielectric material 134. In some embodiments, before forming the dielectric material 134, a liner material 132 is formed on walls of the openings 110 and the first surface 102a of the substrate 102 between the openings 110. In some embodiments, the liner material 132 is a high dielectric constant (high-k) material. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), barium and strontium titanium oxide ($(Ba,Sr)TiO_3$) or a combination thereof. In some embodiments, the liner material 132 includes a single layer or multiple layers.

Then, as shown in FIG. 2E, the portions of the dielectric material 134 outside the openings 110 are removed. In some embodiments, the portions of the dielectric material 134 are removed, for example, through a CMP process for traditional gap filling planarization. In alternative embodiments, a suitable etch back process may be performed. Thereafter, the dielectric layers 144 are formed respectively in the openings 110 by the remaining portions of the dielectric material filling the openings 110. In some embodiments, the portions of the liner material 132 outside the openings 110 are removed simultaneously with the portions of the dielectric material 134 outside the openings 110, and the liner layers 142 are formed respectively in the openings 110 by the remaining portions of the liner material filling the openings 110. In some embodiments, each of the isolation structures 140 includes the dielectric layer 144 and the liner layer 142 aside the dielectric layer 144.

Figure 2F:
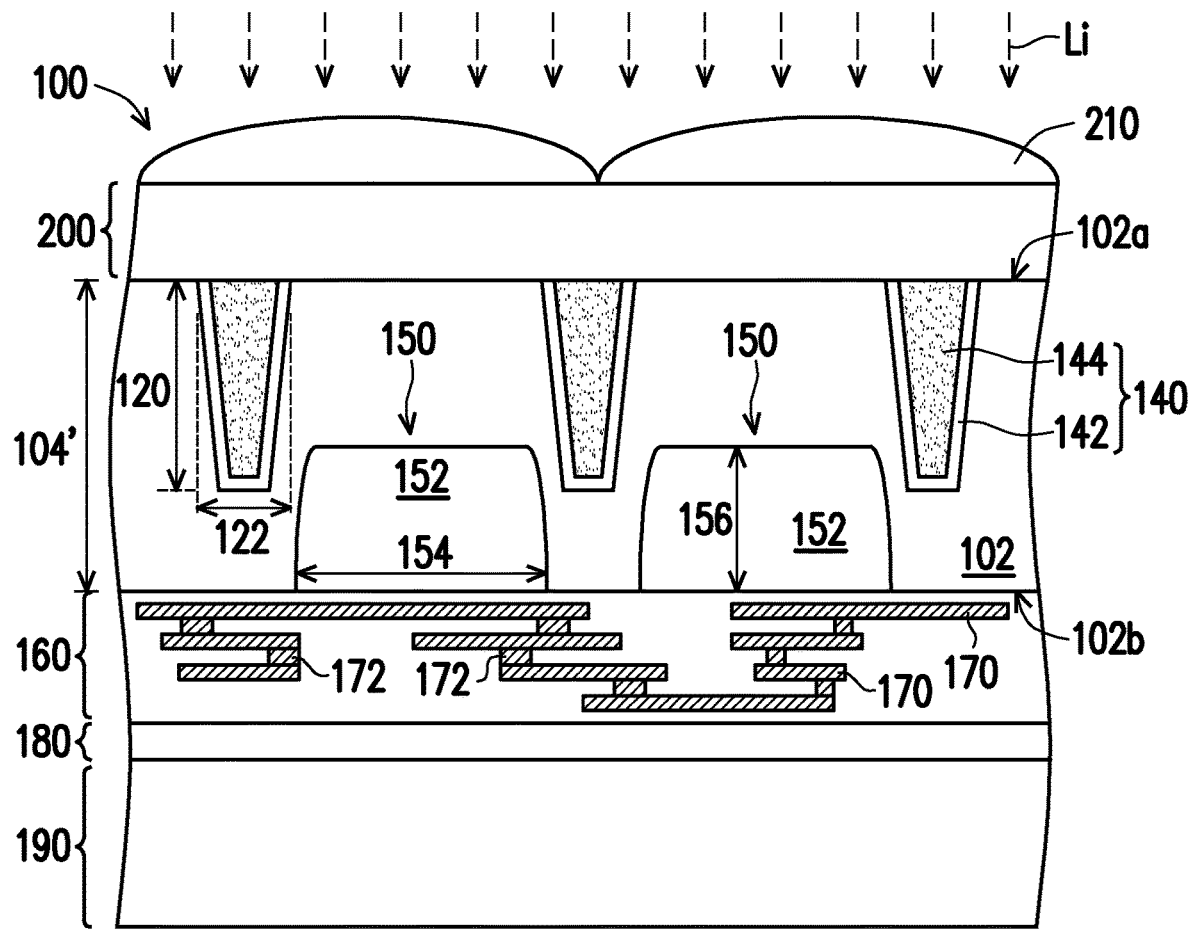

Referring to FIG. 2F, in Step 50, a color filter layer 200 may be formed over the first surface 102a of the substrate 102. In some embodiments, the color filter layer 200 may contain a plurality of color filters that may be positioned such that the incoming radiation is directed thereon and therethrough. In some embodiments, the color filters may include a dye-based (or pigment based) polymer or resin for filtering a specific wavelength band of the incoming radiation, which corresponds to a color spectrum (e.g., red, green, and blue). In some embodiments, thereafter, a micro-lens layer 210 containing a plurality of micro-lenses is formed over the color filter layer 200. In some embodiments, the micro-lenses direct and focus the incoming radiation toward specific radiation-sensing regions in the substrate 102, such as the pixels 150. In some embodiments, the micro-lenses may be positioned in various arrangements and have various shapes depending on a refractive index of a material used for the micro-lens and distance from a sensor surface. In some embodiments, the substrate 102 may also undergo an optional laser annealing process before the forming of the color filter layer 200 or the micro-lens layer 210. For a BSI image sensor device such as the semiconductor image sensor device 100, the pixels 150 are operable to detect radiation, such as an incident light $L_i$, that is projected toward the substrate 102 from the first surface 102a.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity. For example, an anti-reflection coating (ARC) layer may be formed over the first surface 102a of the substrate 102 before the formation of the color filter layer 200 and/or the micro-lens layer 210.

It is also understood that the discussions above pertain mostly to a pixel region of the semiconductor image sensor device 100. In addition to the pixel region, the semiconductor image sensor device 100 also includes a periphery region, a bonding pad region, and a scribe line region. The periphery region may include devices that need to be kept optically dark. These devices may include digital devices, such as application-specific integrated circuit (ASIC) devices or system-on-chip (SOC) devices, or reference pixels used to establish a baseline of an intensity of light for the semiconductor image sensor device 100. The bonding pad region is reserved for the formation of bonding pads, so that electrical connections between the semiconductor image sensor device 100 and external devices may be established. The scribe line region includes a region that separates one semiconductor die from an adjacent semiconductor die. The scribe line region is cut therethrough in a later fabrication process to separate adjacent dies before the dies are packaged and sold as integrated circuit chips. For the sake of simplicity, the details of these other regions of the semiconductor image sensor device 100 are not illustrated or described herein.

Figure 3:
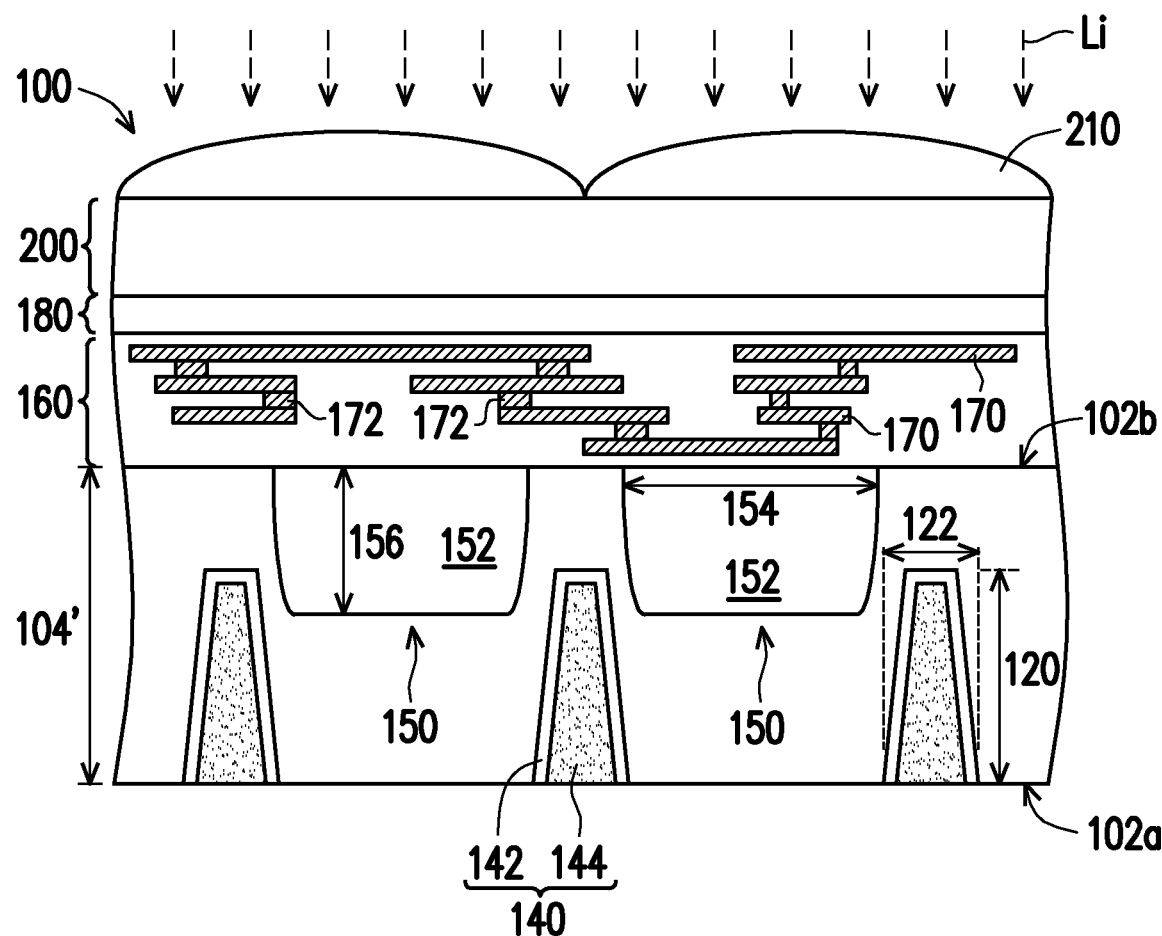
FIG. 3 is a cross-sectional view illustrating a semiconductor image sensor device in accordance with some embodiments.

The above discussions also pertain to a BSI image sensor device. However, it is contemplated that the various aspects of the present disclosure may be applied to a front side illuminated (FSI) image sensor device as well. FIG. 3 is a cross-sectional view illustrating a semiconductor image sensor device in accordance with some embodiments. Referring to FIG. 3, the semiconductor image sensor device 100 is a FSI image sensor device, and it also uses pixels 150 similar to the pixels 150 discussed above to detect light $L_i$, though the light $L_i$ is projected (and enters the substrate 102) from the front side (for example, the second surface 102b), rather than the back side (for example, the first surface 102a). In some embodiments, the color filter layer 200 including color filters and the micro-lens layer 210 form over the front side (for example, the second surface 102b). The interconnect structure 160 is implemented in a manner so as to not impede or obstruct the path of incident light $L_i$ projected from the front side (for example, the second surface 102b). It can be seen that the isolation structures 140 may also include silicon oxycarbonitride (SiOCN) discussed herein. For the sake of simplicity, the processing details of the FSI image sensor device are not discussed herein.

In some embodiments, the isolation structure of the semiconductor image sensor device such as a DTI structure includes silicon oxycarbonitride (SiOCN). Compared with the conventional isolation structure made of metal such as tungsten, the isolation structure including silicon oxycarbonitride does not cause unwanted current, and thus results in a significant reduction of the white pixels in the image sensor, such as a reduction of 36%. In some embodiments, by an atomic layer deposition (ALD) method, a material of silicon oxycarbonitride fills completely in the opening for the DTI structure, and thus the formed isolation structure may has a high ratio of depth to width. Accordingly, the DTI structure between the neighboring pixels provides a good separation for the neighboring pixels, to prevent the light incident into the radiation-sensing doped region of one pixel from being incident into the radiation-sensing doped region of a neighboring pixel. Therefore, the semiconductor image sensor device has good performance and prevents crosstalk between neighboring pixels.

A semiconductor image sensor device includes a substrate, a first pixel and a second pixel, and an isolation structure. The first pixel and second pixel are disposed in the substrate, wherein the first and second pixels are neighboring pixels. The isolation structure is disposed in the substrate and between the first and second pixels, wherein the isolation structure includes a dielectric layer, and the dielectric layer includes silicon oxycarbonitride (SiOCN).

A semiconductor image sensor device includes a substrate, a plurality of radiation-sensing regions, and a plurality of deep trench isolation (DTI) structures. The radiation-sensing regions are formed in the substrate. The DTI structures are formed in the substrate, wherein each pair of neighboring radiation-sensing regions is separated from one another by a respective one of the DTI structures, the DTI structure has a ratio of depth to width ranging from 2 to 20, the DTI structure includes a dielectric layer, and the dielectric layer includes silicon oxycarbonitride (SiOCN).

A manufacturing method of a semiconductor image sensor device includes at least the following steps. A plurality of trenches is formed in a substrate. Dielectric layers are formed in the trenches respectively by atomic layer deposition (ALD) method, to form deep isolation structures in the substrate. A radiation-sensing region is formed in the substrate between neighboring deep isolation structures.

In accordance with some embodiments of the disclosure, a manufacturing method of a semiconductor image sensor device includes at least the following steps. A plurality of radiation-sensing doped regions are formed in a substrate. A trench is formed in the substrate between the radiation-sensing doped regions. A SiOCN layer is filled in the trench by reacting Bis(tertiary-butylamino)silane (BTBAS) and a gas mixture comprising $N_2O$, $N_2$ and $O_2$ through a plasma enhanced atomic layer deposition (PEALD) method, to form an isolation structure between the radiation-sensing doped regions.

In accordance with some embodiments of the disclosure, a manufacturing method of a semiconductor image sensor device includes at least the following steps. A plurality of radiation-sensing doped regions are formed in a substrate from a first surface of the substrate. A plurality of trenches are formed in the substrate from a second surface opposite to the first surface of the substrate, wherein each trench is disposed between adjacent two of the radiation-sensing doped regions. A plurality of isolation structures are formed in the trenches respectively by reacting Bis(tertiary-butylamino)silane (BTBAS) and a gas mixture comprising $N_2O$, $N_2$ and $O_2$ through a plasma enhanced atomic layer deposition (PEALD) method, wherein a material of the isolation structures includes SiOCN and at least one of silicon oxide ($SiO_2$), silicon carbide (SiC) and silicon carbonitride (SiCN).

In accordance with some embodiments of the disclosure, a manufacturing method of a semiconductor image sensor device includes at least the following steps. A plurality of radiation-sensing doped regions in a substrate from a first surface of the substrate. A plurality of trenches are formed in the substrate from a second surface opposite to the first surface of the substrate, wherein each trench is disposed between adjacent two of the radiation-sensing doped regions. A plurality of isolation structures are formed in the trenches respectively by reacting Bis(tertiary-butylamino) silane (BTBAS) and a gas mixture comprising $N_2O$, $N_2$ and $O_2$ through a plasma enhanced atomic layer deposition (PEALD) method, wherein a material of the isolation structures includes SiOCN and at least one of silicon oxide ($SiO_2$), silicon carbide (SiC) and silicon carbonitride (SiCN). An interconnect structure is formed over the first surface of the substrate. A color filter is formed over the interconnect structure, wherein the interconnect structure is disposed between the substrate and the color filter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor image sensor device comprising:
   forming a plurality of radiation-sensing doped regions in a substrate;
   forming a trench in the substrate between the radiation-sensing doped regions; and
   filling a SiOCN layer in the trench by reacting Bis (tertiary-butylamino)silane (BTBAS) and a gas mixture comprising $N_2O$, $N_2$ and $O_2$ through a plasma enhanced atomic layer deposition (PEALD) method, to form an isolation structure between the radiation-sensing doped regions.

2. The manufacturing method according to claim 1, wherein filling a SiOCN layer in the trench comprises:
   forming a material of SiOCN in the trench and over a back surface of the substrate; and
   removing the material of SiOCN outside the trench.

3. The manufacturing method according to claim 2 further comprising forming a liner material in the trench and over the back surface of the substrate before forming the SiOCN layer in the trench, and removing the liner material and the material of SiOCN outside the trench simultaneously.

4. The manufacturing method according to claim 2, wherein removing the material of SiOCN outside the trench comprises performing a planarization process.

5. The manufacturing method according to claim 1, wherein a ratio of depth to width of the trench is substantially equal to 20.

6. The manufacturing method according to claim 1, wherein the substrate has a thickness ranging from about 1 μm to about 5 μm, the radiation-sensing doped regions have a depth ranging from about 1 μm to about 4 μm, and the trench has a depth ranging from about 0.5 μm to about 3 μm.

7. The manufacturing method according to claim 1, wherein the trench is extended into the substrate from a back surface of the substrate by 1/10 to 3/5 of the thickness of the substrate.

8. The manufacturing method according to claim 7, wherein the radiation-sensing doped regions are extended into the substrate from a front surface opposite to the back surface of the substrate by 1/5 to 4/5 of the thickness of the substrate.

9. A manufacturing method of a semiconductor image sensor device comprising:
   forming a plurality of radiation-sensing doped regions in a substrate from a first surface of the substrate;
   forming a plurality of trenches in the substrate from a second surface opposite to the first surface of the substrate, wherein each trench is disposed between adjacent two of the radiation-sensing doped regions; and
   forming a plurality of isolation structures in the trenches respectively by reacting Bis(tertiary-butylamino)silane (BTBAS) and a gas mixture comprising $N_2O$, $N_2$ and $O_2$ through a plasma enhanced atomic layer deposition (PEALD) method, wherein a material of the isolation structures includes SiOCN and at least one of silicon oxide ($SiO_2$), silicon carbide (SiC) and silicon carbonitride (SiCN).

10. The manufacturing method according to claim 9, wherein the material of the isolation structures includes SiOCN, silicon oxide ($SiO_2$), silicon carbide (SiC) and silicon carbonitride (SiCN).

11. The manufacturing method according to claim 9 further comprising using Argon as a diluted gas.

12. The manufacturing method according to claim 9 further comprising forming a liner material in the trenches before forming the isolation structures, wherein the liner material includes multiple layers.

13. The manufacturing method according to claim 9, before forming the plurality of trenches, further comprising:
   forming an interconnect structure on the first surface of the substrate;
   placing the interconnect structure and the substrate thereover onto a carrier substrate; and
   performing a thinning process onto the substrate.

14. The manufacturing method according to claim 9 further comprising forming a color filter being in direct contact with the second surface of the substrate and the radiation-sensing doped regions.

15. The manufacturing method according to claim 9, wherein bottom surfaces of the trenches are disposed between opposite surfaces of the radiation-sensing doped regions.

16. A manufacturing method of a semiconductor image sensor device comprising:
   forming a plurality of radiation-sensing doped regions in a substrate from a first surface of the substrate;
   forming a plurality of trenches in the substrate from a second surface opposite to the first surface of the substrate, wherein each trench is disposed between adjacent two of the radiation-sensing doped regions;
   forming a plurality of isolation structures in the trenches respectively by reacting Bis(tertiary-butylamino)silane (BTBAS) and a gas mixture comprising $N_2O$, $N_2$ and $O_2$ through a plasma enhanced atomic layer deposition (PEALD) method, wherein a material of the isolation structures includes SiOCN and at least one of silicon oxide ($SiO_2$), silicon carbide (SiC) and silicon carbonitride (SiCN);
   forming an interconnect structure over the first surface of the substrate; and
   forming a color filter over the interconnect structure, wherein the interconnect structure is disposed between the substrate and the color filter.

17. The manufacturing method according to claim 16, wherein the material of the isolation structures includes SiOCN, silicon oxide ($SiO_2$), silicon carbide (SiC) and silicon carbonitride (SiCN).

18. The manufacturing method according to claim 16 further comprising using Argon as a diluted gas.

19. The manufacturing method according to claim 16, wherein bottom surfaces of the trenches are disposed between opposite surfaces of the radiation-sensing doped regions.

20. The manufacturing method according to claim 16 further comprising forming a buffer layer disposed between and in direct contact with the interconnect structure and the color filter.

* * * * *